United States Patent [19]

Bouwknegt

[11] Patent Number: 4,462,737
[45] Date of Patent: Jul. 31, 1984

[54] DEVICE FOR ADVANCING PARTS CONTAINED IN MAGAZINES

[75] Inventor: Jan Bouwknegt, Eindhoven, Netherlands

[73] Assignee: U.S. Philips Corporation, New York, N.Y.

[21] Appl. No.: 308,963

[22] Filed: Oct. 6, 1981

[30] Foreign Application Priority Data

Nov. 6, 1980 [NL] Netherlands ............... 8006058

[51] Int. Cl.³ ............... B65G 59/02; H05K 13/02
[52] U.S. Cl. ............... 414/118; 29/740; 156/297; 198/719; 221/93; 271/148
[58] Field of Search ............... 414/99, 117, 118, 119, 414/120, 121, 122, 123, 124; 271/9, 148, 159; 198/719, 741; 221/93, 94; 29/740, 741, 759; 156/297

[56] References Cited

U.S. PATENT DOCUMENTS

| | | | |
|---|---|---|---|
| 1,060,948 | 5/1913 | Schuster | 294/64 R X |
| 3,456,423 | 7/1969 | Helms | 414/99 X |
| 4,127,432 | 11/1978 | Kuwano et al. | 29/740 X |
| 4,292,116 | 9/1981 | Takahashi et al. | 29/740 X |
| 4,375,126 | 3/1983 | Düll | 29/740 |
| 4,389,272 | 6/1983 | Ferri et al. | 29/740 X |

Primary Examiner—Leslie J. Paperner
Attorney, Agent, or Firm—David R. Treacy

[57] ABSTRACT

Electrical and/or electronic parts are advanced simultaneously in a plurality of magazine tubes which are arranged in a matrix of openings in a grid. A holder below the magazine matrix contains pins in guides aligned with respective magazines, the holder being movable in the direction of the grid to advance the pins into the magazines. Friction between the pins and the holder is adjustable to allow the holder to slide along pins which have pushed their respective stacks to a stop surface in the grid. Preferably, the pins are arranged in rows and a hollow tube passes between the pins, fluid pressure in the tube being varied in order to adjust the level of friction between the pins and the holder.

6 Claims, 3 Drawing Figures

DEVICE FOR ADVANCING PARTS CONTAINED IN MAGAZINES

BACKGROUND OF THE INVENTION

The invention relates to a device for the advancing of a number of stacks of electrical and/or electronic parts, each of the stacks being accommodated in a tubular magazine, each of the magazines being arranged in at least one grid which as a matrix of openings for accommodating the magazines in a pattern according to which the parts have to be arranged on a printed circuit board.

Devices of the kind forming the subject of the present invention are known per se and form part of devices for the correct positioning of electrical and/or electronic parts on printed circuit boards. These parts are of a prismatic shape and have very small dimensions without connection wires, and are also referred to as parts of the "chip" type. The parts are packed in tubular magazines having an internal cross-section which corresponds to the shape of the parts. A number of this kind of magazines is arranged in one or more grids so that their position corresponds to the positions in which the parts have to be positioned on a printed circuit board. Subsequently, the stacks of parts in the magazines are simultaneously pushed upwards until the uppermost parts have reached a position in which they can be picked up by suitable gripping mechanisms, followed by further alignment and transport to the printed circuit board.

A drawback of a device of the described kind which is known from DE-OS 27 16 330, to which U.S. Pat. No. 4,127,432 corresponds, is that parts of different thickness cannot be simultaneously processed, because the upper edges of the magazines are all situated in one plane and the stacks of parts are advanced over approximately the same step height. This means that in practice only parts having a thickness equal to the step height can be simultaneously processed.

In order to eliminate this drawback, it has already been proposed to move the stacks of parts in the magazines upwards by means of hydraulic pistons which advance the stacks regardless of the thickness of the parts until the upper side of all parts contacts an abutment, so that the upper sides of the parts are at a defined level, thus enabling transfer by suitable means. The complex and hence expensive and vulnerable construction is a drawback of this device.

SUMMARY OF THE INVENTION

The invention has for its object to provide a device having a simple construction whereby stacks of parts of possibly different thickness can be smoothly advanced until they contact given abutments.

The device in accordance with the invention is characterized in that underneath the grid there is arranged a holder which is movable in the direction of the grid and which comprises a matrix of guides which corresponds to the matrix of openings in the grid, the guides accommodating pins and the friction of the pins in the holder being adjustable.

This device makes it possible to impart only very little friction to the pins in the guides initially. The holder with pins is then moved upwards, the pins which cooperate with a stack of parts then pressing the stacks upwards until the upper part of each stack contacts an abutment. When the holder is moved further upwards yet, the pins of the stacks already contacting the abutment will then smoothly slide in their guide. By making the step height of the holder slightly larger than the thickness of the part having the largest thickness, it is ensured that all parts contact their associated abutment after completion of this step.

Subsequently, the friction between the pins and their guide can be made very large, so that the pins behave as though they are rigidly connected to the holder. By moving the holder up and down, all stacks can be moved up or down over a given, desirable distance without changing the position of the stacks with respect to one another.

A further preferred embodiment of the device in accordance with the invention is characterized in that between all rows of pins of the matrix there are situated portions of a tube so that each of the pins contacts a tube portion in at least two diametrically oppositely situated locations, the tube portions being made of an elastic material and the friction between the tube portions and the pins being adjustable by the introduction of a pressure medium into the tube portions.

Even though separate tube portions can be provided between the different rows of pins, in accordance with the invention all tube portions preferably form part of one tube which is disposed between the rows of pins in a meanderlike configuration.

It has been found that the tube can be proportioned so that the friction experienced by the pins when there is no or little internal pressure in the tube is very low and substantially the same for all pins. When pressure medium is admitted to the tube portions, the portions will expand so that the contact pressure between tube and pins will increase. It has been found that in this very simple construction the friction between each of the pins and the tube or tube portions is exactly the same; this is a very important aspect for proper operation of the device.

The tube or tube portions may be made of any suitable elastic material. It has been found that silicone rubber is a very attractive tube material, among other reasons because hardly any stick-slip occurs between tube and pins when this material is used.

In order to ensure that both sides of the outer rows of pins also contact a tube portion, the circumference of the holder must be provided with either a row of rigid pins or with a upright edge against which the outer tube portions can abut.

A further embodiment of the pin holder is formed by two plates which are spaced apart and which comprise holes as guides for the pins, the tube or tube portions being disposed between these two plates.

The invention will be described in detail hereinafter with reference to the accompanying diagrammatic drawing.

DESCRIPTION OF THE PREFERRED EMBODIMENT

Figure 1:
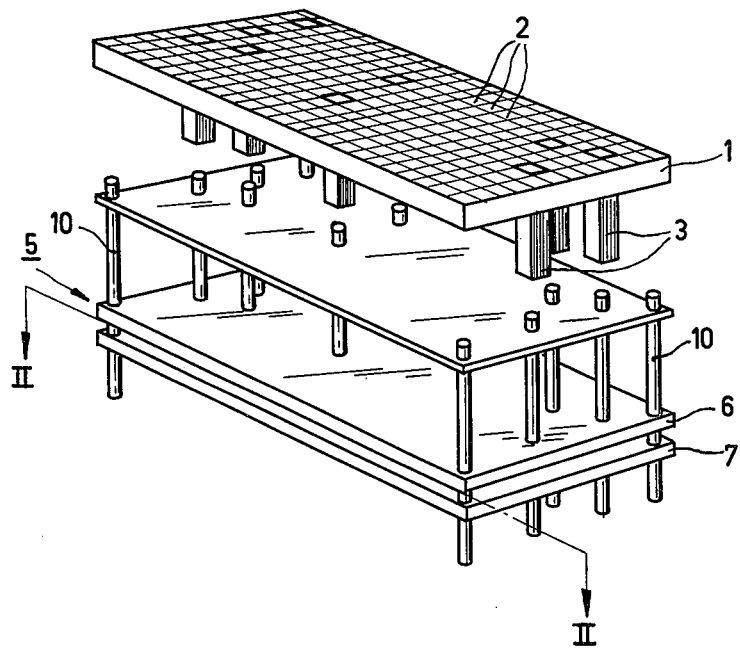
FIG. 1 is a perspective view of a device with a grid with some magazines containing stacks of parts, and a lower holder with pins for pressing the stacks upwards.
Figure 3:
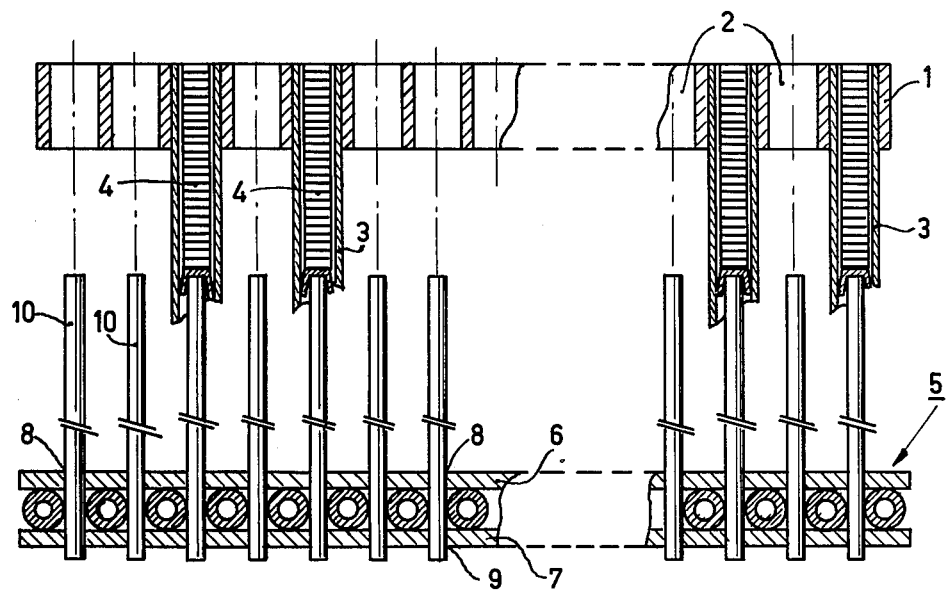
FIG. 3 is a sectional view, taken along the line III—III, of the device shown in FIG. 2.

The reference numeral 1 in FIG. 1 denotes a grid with a matrix of openings 2 in which magazines 3 can be arranged. The magazines 3 contain stacks of electrical parts (see FIG. 3). The magazines 3 are arranged in the grid 1 so that their position corresponds to the positions in which the relevant parts have to be arranged on a printed wiring board.

Underneath the grid 1 there is provided a pin holder 5 which is formed mainly by two parallel plates 6 and 7 in which there is provided a matrix of guides which corresponds to the matrix of the grid. Each of the guides is formed by a hole 8 in the plate 6 and a corresponding hole 9 in the plate 7. Each of the guides accommodates a pin 10. The pins 10 are thus aligned so that the center line of each of the pins coincides substantially with the center line of an opening 2 in the grid 1. At the areas where a magazine 3 is present in the grid, the upper end of the relevant pin 10 will cooperate with the lower side of the stack of parts 4.

Figure 2:
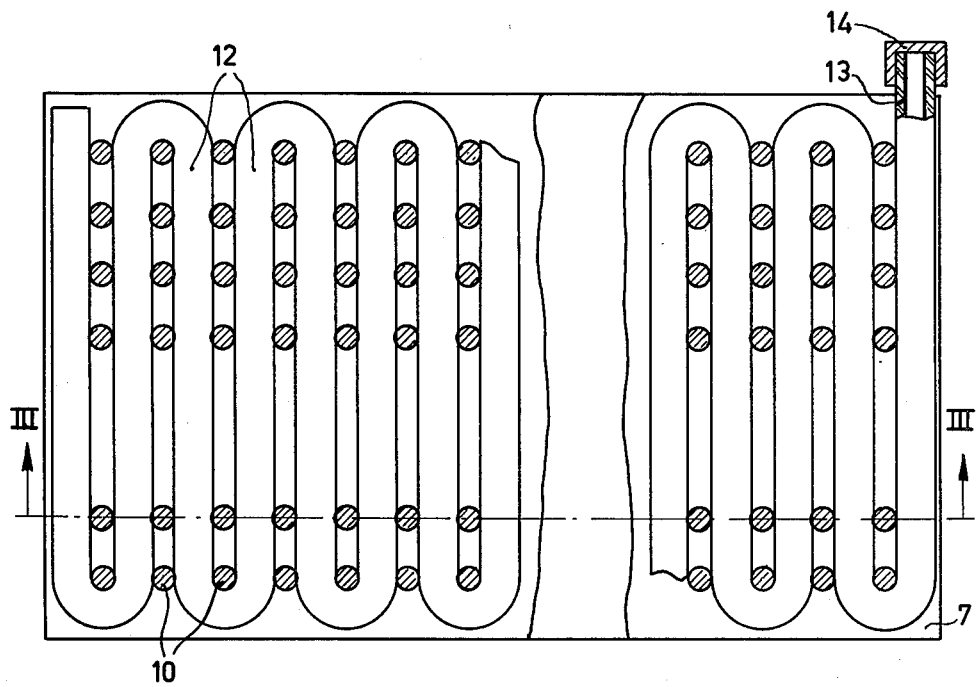
FIG. 2 is a sectional view, taken along the line II—II, of the pin holder of the device shown in FIG. 1.

As is clearly shown in FIG. 2, the pins form a number of rows. A tube 12 is disposed between said rows of pins, in a meander configuration. Each of the pins 10 thus contacts a tube 12 in two diametrically oppositely situated locations. The tube 12 is in this case made of a silicone rubber which is an elastic material. The end 13 of the tube 12 is provided with a plug 14 which is constructed so that it can also be used for connection to a pressure medium source. A pressurized medium can thus be admitted to the tube 12. The contact pressure and hence the friction between the pins 10 and the tube 12 can thus be accurately adjusted. It has been found that this very simple step ensures that the friction experienced by each of the pins 10 is substantially the same. This is of major importance for smooth operation of the device.

The pin holder 5 can be moved upwards by a means of a mechanism not shown. When the pins 10 have reached the lower side of the stacks of parts 4, the upward movement of the pin holder 5 will always take place in a step which is equal to or slightly larger than the thickness of the thickest one of the relevant parts. The uppermost part of the stacks is then pressed against an abutment (not shown). The thinner parts will reach the abutment sooner than the thicker parts. This is possible in the device in accordance with the invention, because the pins 10 slide very easily in their guides until all parts contact the relevant abutment. Subsequently, the parts whose position is accurately known can be readily picked up by a gripping mechanism (mechanical or utilizing vacuum) for further transport.

What is claimed is:

1. A device for advancing a number of stacks of parts, each of said stacks being accommodated in a tubular magazine, comprising at least one grid having a matrix of openings for accommodating the magazines in a pattern according to which the parts are to be arranged on a printed circuit board, and a corresponding number of pins, each pin being aligned under a respective stack, characterized by comprising a holder disposed underneath the grid and movable in the direction of the grid, said holder having a matrix of guides which corresponds to the matrix of openings in the grid, each of said pins being accommodated in one of said guides; and further characterized in that said holder comprises means for adjusting the friction between each of the pins and the holder after a movement of the holder.

2. A device as claimed in claim 1, characterized in that said means for adjusting friction provides a same friction value simultaneously between each of the pins and the holder; and that said means permits adjusting the friction from a small value during one portion of holder movement, to a larger value during another portion of holder movement.

3. A device as claimed in claim 1 characterized in that said pins are arranged in a matrix of aligned rows; and said means for adjusting friction comprises portions of a tube made of an elastic material, disposed between the respective rows of pins such that each of the pins contacts a tube portion in at least two diametrically oppositely situated locations; and the device further includes means for introducing a pressure medium into the tube portions so as to adjust friction between the tube portions and the pins.

4. A device as claimed in claim 3, characterized in that said tube portions form part of a single tube disposed in a meander-like configuration between the rows of pins.

5. A device as claimed in claim 3 or 4, characterized in that the tube portions are made of a silicone rubber.

6. A device as claimed in claim 1, 2, 3, or 4, characterized in that the pin holder is formed by two plates spaced apart, having aligned holes which serve as said guides for the pins; and the means for adjusting friction is disposed between said two plates.

* * * * *